(12) United States Patent
Shulman et al.

(10) Patent No.: US 11,012,269 B2
(45) Date of Patent: May 18, 2021

(54) MULTI-CHANNEL TRANSMISSION WITH FLEXIBLE GAINS

(71) Applicant: Intel Corporation, Santa Clara, CA (US)

(72) Inventors: Shaul Shulman, Ramat Gan (IL); Nathan Goichberg, Ashdod (IL)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 16/464,485

(22) PCT Filed: Dec. 29, 2016

(86) PCT No.: PCT/US2016/069151
§ 371 (c)(1),
(2) Date: May 28, 2019

(87) PCT Pub. No.: WO2018/125126
PCT Pub. Date: Jul. 5, 2018

(65) Prior Publication Data
US 2019/0312761 A1 Oct. 10, 2019

(51) Int. Cl.
*H04L 27/00* (2006.01)
*H04L 27/26* (2006.01)
(Continued)

(52) U.S. Cl.
CPC ....... *H04L 27/0002* (2013.01); *H03G 3/3042* (2013.01); *H04B 1/0483* (2013.01); *H04L 27/2697* (2013.01); *H04L 5/06* (2013.01)

(58) Field of Classification Search
CPC ........... H04N 21/6118; H04N 21/6168; H04N 21/44209; H04B 17/21; H04L 27/0002; H04L 5/06; H04L 25/0204; H03G 3/3042
See application file for complete search history.

(56) References Cited

U.S. PATENT DOCUMENTS 9,480,028 B1 * 10/2016 Frieh ................. H04W 52/367
2006/0160506 A1 * 7/2006 Smentek ............. H03G 3/3084
455/127.3
(Continued)

FOREIGN PATENT DOCUMENTS

CN 1412994 A 4/2003
CN 102386869 A 3/2012
(Continued)

OTHER PUBLICATIONS

International Search Report and Written Opinion dated Aug. 30, 2017 for PCT Application PCT/US2016/069151.
(Continued)

*Primary Examiner* — Aristocratis Fotakis
(74) *Attorney, Agent, or Firm* — Maschoff Brennan

(57) ABSTRACT

A device includes a digital frontend. The digital frontend is configured to digitally modulate symbols for digital signals of a plurality of channels according to a transmission protocol. Each channel is associated with at least one respective carrier frequency within a transmission bandwidth. The digital frontend is further configured to combine the digital signals to obtain a digital output signal. The device further includes an analog frontend having a digital-to-analog converter configured to convert the digital output signal into an analog output signal. The analog frontend also includes a programmable gain amplifier configured to apply an analog gain to the analog output signal. The device further includes a control logic configured to determine the analog gain based on calibration data indicative of the frequency response of the analog frontend across a transmission bandwidth.

20 Claims, 6 Drawing Sheets

(51) Int. Cl.
    *H03G 3/30*     (2006.01)
    *H04B 1/04*     (2006.01)
    *H04L 5/06*     (2006.01)

(56) References Cited

U.S. PATENT DOCUMENTS

| | | | |
|---|---|---|---|
| 2008/0181283 A1* | 7/2008 | Elhanati | H03G 3/3052 375/130 |
| 2009/0190638 A1 | 7/2009 | Meir et al. | |
| 2010/0131999 A1* | 5/2010 | Kfir | H04L 12/2801 725/111 |
| 2011/0170632 A1* | 7/2011 | Danzig | H04L 5/06 375/296 |
| 2015/0043625 A1 | 2/2015 | Gomez et al. | |
| 2016/0182153 A1* | 6/2016 | Wu | H04Q 11/0066 398/45 |

FOREIGN PATENT DOCUMENTS

| | | |
|---|---|---|
| CN | 104953971 A | 9/2015 |
| WO | 2015027486 A1 | 3/2015 |

OTHER PUBLICATIONS

Office Action for Chinese Patent Application 201680091237.2 dated Dec. 16, 2020.

* cited by examiner

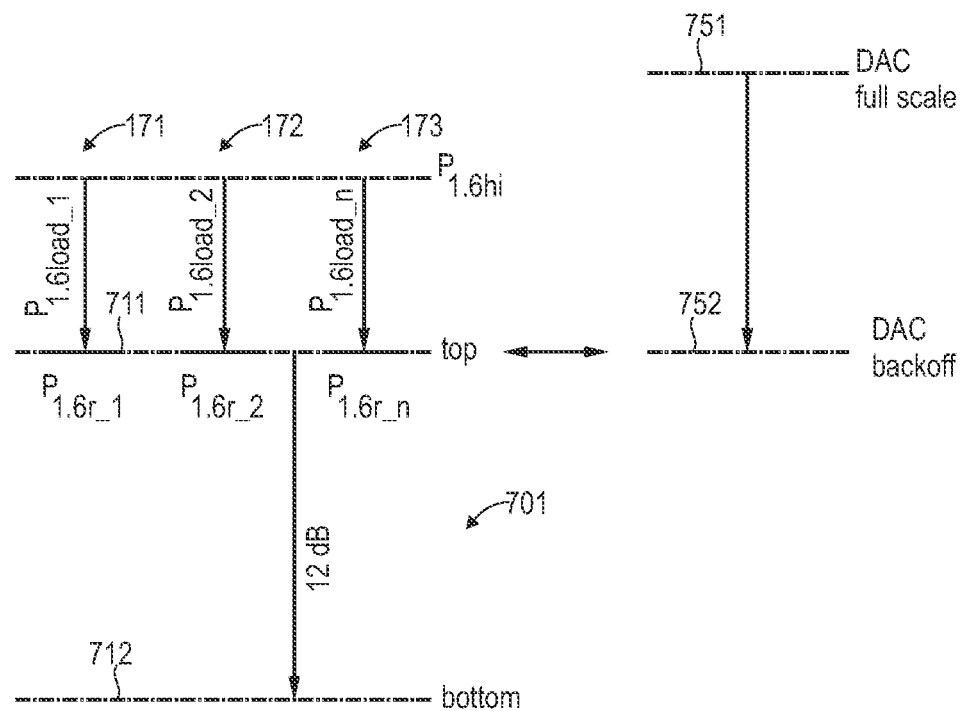

MULTI-CHANNEL TRANSMISSION WITH FLEXIBLE GAINS

This application is a National Phase entry application of International Patent Application No. PCT/US2016/069151 filed on Dec. 29, 2016, entitled "MULTI-CHANNEL TRANSMISSION WITH FLEXIBLE GAINS" in the name of Shaul Shulman et al. and is hereby incorporated by reference in its entirety.

FIELD

Various embodiments of the invention generally relate to providing an analog output signal including symbols of a plurality of channels. Various embodiments of the invention specifically relate to determining an analog gain applied to the analog output signal.

BACKGROUND

In various communication systems, multi-channel transmission is employed. Here, multiple channels are multiplexed onto a transmission spectrum, wherein different channels occupy different bandwidths (BWs) within the transmission spectrum. Each channel may include data of a certain application and/or subscriber.

Sometimes, it can be required to set a signal level—e.g., defining the power or power spectral density (PSD)—individually for each one of the plurality of channels. Different channels of the plurality of channels may employ at different signal level.

An example of a multi-channel transmission protocol is Data-Over-Cable Service Interface Specifications (DOCSIS) 3.1, Cable Television Laboratories, Inc. 2013-2016. For example, the physical layer of the DOCSIS 3.1 transmission protocol requires a specific output power for upstream transmission, see DOCSIS 3.1, Physical Layer Specification, CM-SP-PHYv3.1-I09-160602, e.g., Chapter Chapters 7.4.12.2 and 7.4.12.3.

To achieve this, typically, a certain gain is set at the transmitter. For example, according to reference implementations, the analog gain may be set individually for each channel of a plurality of channels. Thereby, the gain of each channel may be set accurately and with great flexibility.

However, such techniques face certain restrictions and drawbacks. For example, according to reference implementations, an analog programmable gain amplifier may be required for each channel. Provisioning a plurality of programmable gain amplifiers can be costly. Furthermore, this may restrict the flexibility with which channels can be created or discarded.

SUMMARY

Therefore, a need exists for advanced techniques of multi-channel transmission. In particular, a need exists for techniques of multi-channel transmission which enable to flexibly set the gains for the various channels. Furthermore, a need exists for techniques of multi-channel transmission which overcome or mitigate at least some of the above-identified restrictions and drawbacks.

This need is met by the features of the independent claims. The dependent claims define embodiments.

According to examples, a device includes a digital frontend. The digital frontend is configured to digitally modulate symbols for digital signals of a plurality of channels according to a transmission protocol. Each channel is associated with at least one respective carrier frequency within a transmission bandwidth. The digital frontend is further configured to combine the digital signals to obtain a digital output signal. The device further includes an analog frontend having a digital-to-analog converter configured to convert the digital output signal into an analog output signal. The analog frontend also includes a programmable gain amplifier configured to apply an analog gain to the analog output signal. The device further includes a control logic configured to determine the analog gain based on calibration data indicative of the frequency response of the analog frontend across a transmission bandwidth.

According to an example, a method includes digitally modulating symbols for digital signals of a plurality of channels according to a transmission protocol. Each channel is associated with at least one respective carrier frequency within a transmission bandwidth. The method further includes combining the digital signals to obtain a digital output signal. The method further includes converting the digital output signal into an analog output signal. The method further includes a programmable gain amplifier applying an analog gain to the analog output signal. The method further includes determining the analog gain based on calibration data which is indicative of the frequency response of the analog frontend across the transmission bandwidth.

It is to be understood that the features mentioned above and features yet to be explained below can be used not only in the respective combinations indicated, but also in other combinations or in isolation, without departing from the scope of the present invention. Features of the above-mentioned aspects and embodiments may be combined with each other in other embodiments.

BRIEF DESCRIPTION OF THE DRAWINGS

FIG. 7 schematically illustrates a dynamic range window for digital signals of a plurality of channels according to various examples and further illustrates a predefined input signal level of a digital-to-analog converter of the analog frontend according to various examples.

DETAILED DESCRIPTION OF EMBODIMENTS

Figure 1:
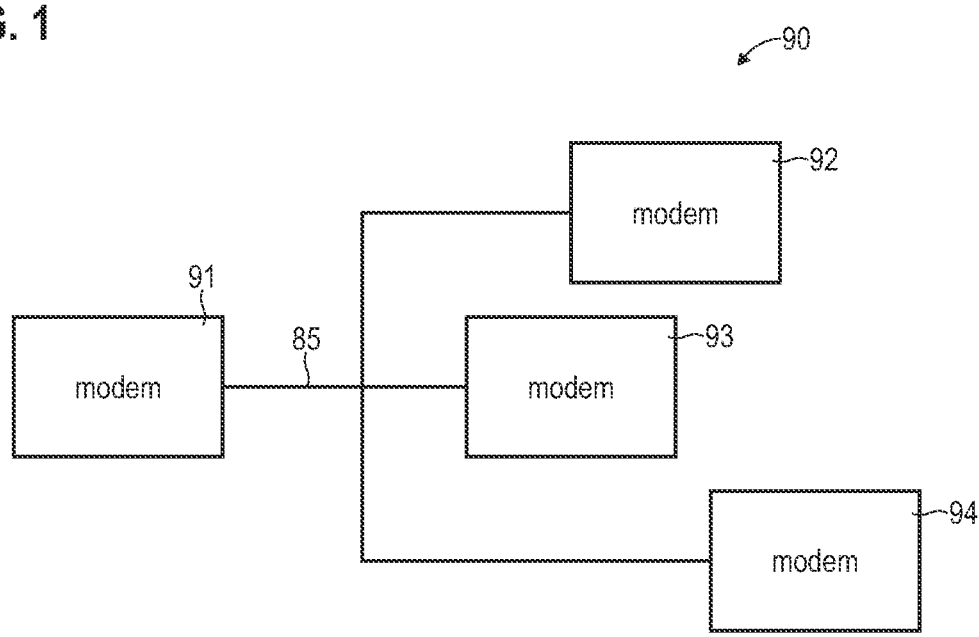
FIG. 1 schematically illustrates a communication system including a plurality of modems according to various examples.

Exemplary embodiments of the invention will be described with reference to the drawings. While some embodiments will be described in the context of specific fields of application, e.g. in the context of certain spectral ranges and communication techniques, the embodiments are not limited to this field of application. The features of the various embodiments may be combined with each other unless specifically stated otherwise.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various techniques regarding multi-channel transmission over a transmission medium are described herein. For example, a number of 2-50 channels may be multiplexed on the transmission medium using frequency division duplex (FDD). Hence, one or more carrier frequencies of different channels may be offset from each other in frequency domain. Optionally, it is also possible to employ time division duplex (TDD). Each channel may be self-contained, i.e., decoding of a specific channel may be possible without relying on any information of a further channel. Different channels may be associated with different subscribers and/or applications.

The techniques described herein may be applied to various transmission media. Examples include wireless over-the-air communication and communication via wired transmission media such as coaxial cables and copper cables. For illustrative purposes, hereinafter, reference will be primarily made to a cable communication system such as one described by DOCSIS 3.1. However, similar techniques may be readily applied to different communication systems employing, e.g., different transmission media and/or different transmission protocols. Further examples include the Third Generation Partnership Project (3GPP) multi-carrier or carrier aggregation technology.

The techniques described herein may be employed for Internet-of-Things applications and Connected Home applications. For example, the techniques may be employed for a fast and reliable Internet connection to subscriber households.

The techniques described herein enable to flexibly and individually set gains for each channel of a plurality of channels. In other words, by the techniques described herein it is possible to flexibly and individually set the signal level of each channel of a plurality of channels. According to the techniques described herein, this may be achieved with high accuracy and hardware of reduced complexity.

For example, a cable modem communication system may include digital signal modulators configured to modulate digital signals of a plurality of channels, a digital-to-analog converter (DAC), and a programmable gain amplifier (PGA). The DOCSIS 3.1 transmission protocol requires the cable modem to transmit upstream power with high precision at a commanded signal level/output power. To achieve that, a digital gain needs to be set for the digital signals and an analog gain needs to be set for the PGA. Hereinafter, techniques are described which enable to accurately determine these gains so that the signal-to-noise ratio (SNR) of the transmitter is optimal under DOCSIS 3.1 specification restrictions.

In particular, according to some examples, it is possible that the digital signals of the plurality of channels are combined in the digital domain before digital-to-analog conversion takes place. Then, a common PGA can be used to apply an analog gain to the thus obtained combined analog output signal. Such a hardware architecture does not require multiple analog amplifiers for each digital signal of the plurality of channels. Thereby, the number of analog circuitry can be reduced. This simplifies the system architecture.

At the same time, the combined analog amplification does not compromise the flexibility of individually setting the gains for the various channels. In particular, according to various examples, it is possible to individually determine a digital gain for each digital signal of the digital signals of the plurality of channels. By using different digital gains for different channels of the plurality of channels, it is possible to provide different PSDs for different channels of the plurality of channels.

According to examples, the analog gain of the common PGA is determined based on calibration data. The calibration data is indicative of the frequency response of the analog frontend across the transmission BW. For example, the frequency response may specify an amplification characteristics and/or filtering characteristics of the analog frontend. The frequency response may specify deviations from a nominal gain as a function of frequency. For example, the PGA may amplify the analog output signal at a first frequency at a first gain which is different than second gain at which the PGA amplifies the analog output signal at a second frequency—even though the same nominal gain has been specified. Similarly, an analog filter may contribute significantly to the frequency response. By considering calibration data, it becomes possible to accurately set the signal level of the analog output signal for the various channels—even though one or more carrier frequencies of the various channels are spread across the transmission BW. For example, because the amplification characteristic of the PGA is not flat over frequency, the applied analog gain may correspond to the weakest frequency in the transmission BW or generally a low-amplification regime and the remaining frequencies in the transmission BW can be equalized by appropriately attenuating the digital signals, i.e., by appropriately setting the digital gains.

FIG. 1 schematically illustrates aspects with respect to a communication system 90. For example, the communication system 90 may employ a coaxial cable 85 for communication between different modems 91-94. Here, the modem 91 may be at a central distribution point (DP). The modems 92-94 may be located at subscriber premises and, therefore, are sometimes referred to customer premises equipment (CPE). Hence, the DP modem 91 can transmit downstream (DS) data to the plurality of CPE modems 92-94 associated with different subscribers/users. Furthermore, the DP modem 91 can receive upstream (US) data from the plurality of CPE modems 92-94.

Typically, the DP modem 91 is referred to as Cable Modem Termination System (CMTS) or head end modem. In some examples, it is possible that the DP modem 91 is configured different than the CPE modems 92-94. For example, the DP modem 91 may implement different rules for determining a transmit power if compared to the CPE modems 92-94. For example, the DP modem 91 may implement a plurality of individual nodes, each with it's own power calculation taking place.

As illustrated in FIG. 1, it is possible that the line length of the coaxial cables 85 is different for different modems 92-94. This may be one of the reasons why transmitters of the modems 91-94 can be configured to flexibly set the transmission power. For example, by adjusting the transmission power based on the line length, a certain signal-to-noise ratio (SNR) may be ensured at the receiving side.

Figure 2:
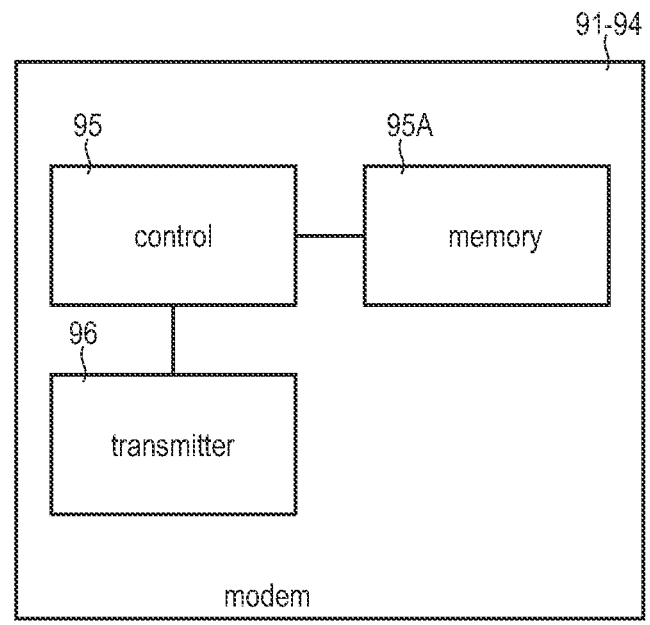
FIG. 2 schematically illustrates a modem of the communication system in greater detail according to various examples, the modem including a transmitter.

FIG. 2 schematically illustrates aspects with respect to the modems 91-94. The modems 91-94 include a transmitter 96. The transmitter 96 may be configured to output an analog radio frequency (RF) signal (analog output signal) to the coaxial cable 85. For example, the analog output signal may occupy a transmission BW having a lower band edge of 5 MHz and an upper band edge situated in the range of 5 MHz-205 MHz; this may apply, e.g., for US transmission. For DS transmission, the analog output signal may occupy a transmission BW having a lower edge situated in the range of 20 MHz-260 MHz and an upper edge situated in the range of 1200 MHz-1800 MHz. The transmitter 96 may include a digital frontend (DFE) configured to modulate symbols for one or more digital signals. The transmitter 96 may also include an analog frontend (AFE) configured to amplify and filter the analog output signal which is determined based on the one or more digital signals (in FIG. 2, both, the DFE and the AFE are not shown).

The transmitter 96 is controlled by a control logic 95. The control logic 95 may be implemented as hardware and/or software. For example, the control logic 95 may be implemented by a microcontroller, a field programmable gate array (FPGA), a processor, etc. In some examples, the control logic 95 may load control instructions stored in a non-volatile memory 95A and execute the control instructions; this may cause execution of techniques regarding determining of an analog gain of a PGA of the transmitter 96 and/or of digital gains of the transmitter 96 according to various techniques described herein.

Figure 3:
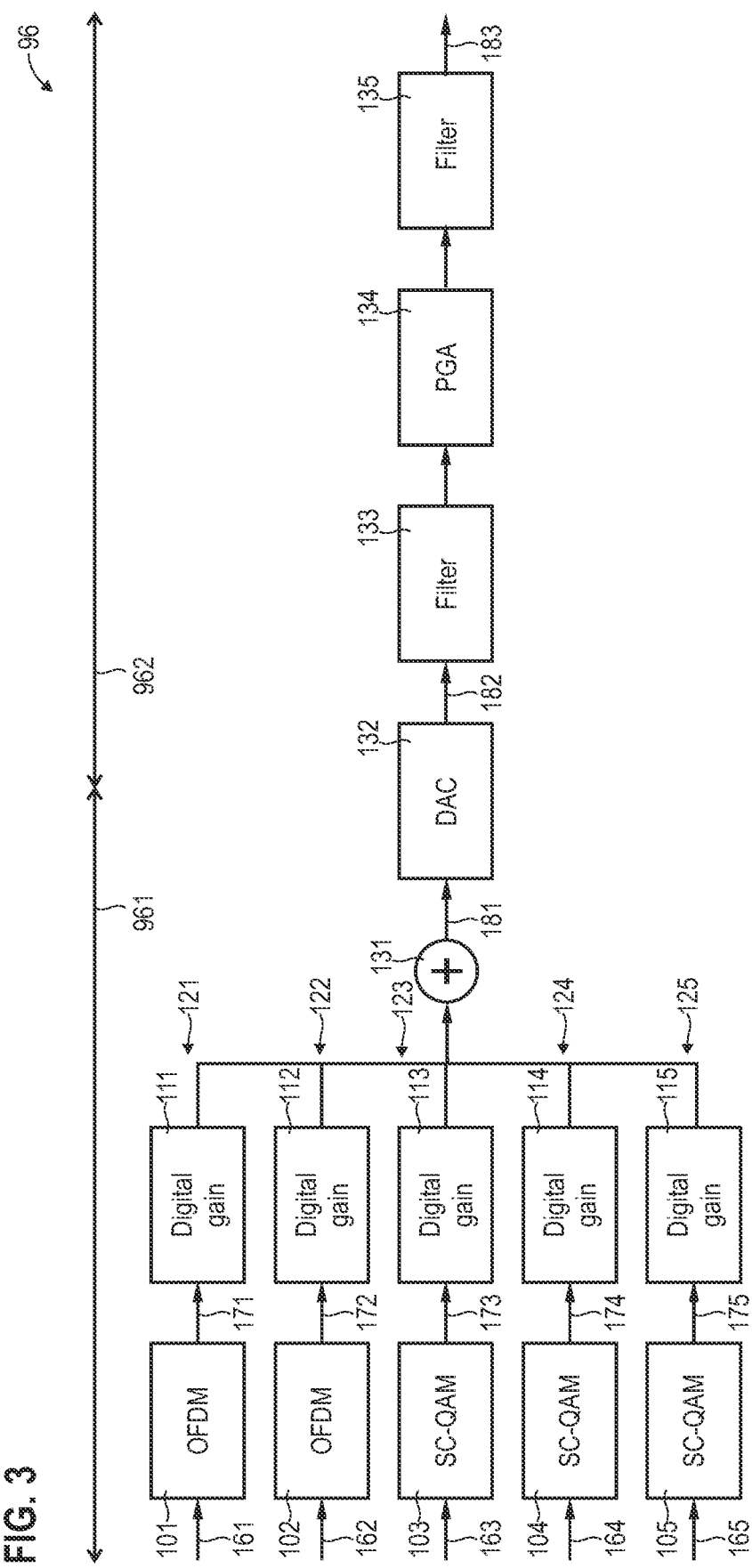
FIG. 3 schematically illustrates a digital frontend and an analog frontend of the transmitter of the modem according to various examples.

FIG. 3 schematically illustrates aspects with respect to the transmitter 96. FIG. 3 illustrates the DFE 961 and the AFE 962. For example, the DFE 961 may be implemented by a system-on-chip (SOC). According to the SOC architecture, a plurality of logical blocks are integrated on the same die as digital circuitry. For example, it would be possible that the control logic 95 is integrated into the SOC architecture of the DFE 961.

Generally, the transmitter 96 illustrated in FIG. 3 may operate according to the DOCSIS 3.1 transmission protocol. The transmitter 96 illustrated in FIG. 3 may implement functionality of the physical layer. The physical layer corresponds to Layer 1 of the Open Systems Interconnection (OSI) model. Hence, the transmitter 96 may interface the transmission medium, e.g., the coaxial cable 85. It can provide for modulation of symbols.

In FIG. 3, the DFE 961 includes a branched architecture. In the example of FIG. 3, the DFE 961 defines a number of five signal flow branches, wherein each branch is associated with a respective channel 121-125.

For each channel 121-125, data 161-165 is received. For example, the data 161-165 could be encoded in Layer 2 protocol data units (PDUs). The data 161-165 associated with the different channels 121-125 may encode information of different applications. For example, different applications may be associated with different TV shows, Internet data, etc. For example, the data 161-165 may be received as packetized data or as a data stream. Alternatively or additionally, the DS data 161-165 associated with the different channels 121-125 may be associated with different subscribers, i.e., may be intended for different CPE modems 92-94.

Then, the DFE 961 is configured to digitally modulate symbols for digital signals 171-175. For this, digital modulators 101-105 are implemented, e.g., in software code and/or in hardware. The digital signals 171-175 may correspond to a stream of data. The digital signals 171-175 may include padding or zero-filled periods.

The modulation is implemented in accordance with the transmission protocol. For example, according to the DOCSIS 3.1 transmission protocol, it is possible to employ different modulation schemes for modulating the symbols of different digital signals 171-175. In the example of FIG. 3, the modulators 101, 102 are configured to modulate the respective digital signals 171, 172 according to the Orthogonal Frequency Division Multiplexing (OFDM) modulation scheme. Here, a plurality of subcarriers is employed per channel 121-125. For OFDM, different modulation formats may be employed; examples include binary phase shift keying, Quadrature phase shift keying, Quadrature Amplitude Modulation (QAM) using different constellations, e.g., in the range of 8-4096-QAM. For OFDM, different bit loading per subcarrier can be employed. Further, in the example of FIG. 3, the modulators 103-105 are configured to modulate the respective digital signals 173-175 according to Single Carrier QAM (SC-QAM). Here, per channel 123-125 a single carrier frequency is employed.

Once the modulated digital signals 171-175 are obtained, a digital gain can be set by the digital amplifiers 111-115. Sometimes, the digital gain is also referred to as digital attenuation; sometimes, digital gain and digital attenuation may be used as different representations of the same quantity. Here, the DFE 961 can be configured to apply a respective digital gain to each digital signal 171-175. Different digital gains can be applied to different digital signals 171-175. Thereby, it becomes possible to individually set the signal level of the analog output signal 183 for different channels 121-125.

Next, the digital signals 171-175—after application of the digital gain—are combined to obtain a digital output signal 181. The digital output signal 181 is then fed to a DAC 132 which is configured to convert the digital output signal 181 into an analog output signal 182. It is possible that the DAC 132 applies a certain gain. Also, the DAC 132 may add certain noise such as quantization noise and DAC aliases. An anti-aliasing filter 133 may be provided.

The filtered analog output signal 182 is then fed to the PGA 134 of the AFE 962. The PGA 134 is configured to amplify the analog output signal 182 using a variable analog gain. Sometimes, the analog gain setting of the PGA 134 may be adjustable at a certain discrete adjustment increment.

In the example of FIG. 3, a further filter 135 is provided before the analog output signal 182—which has been amplified and filtered—is eventually output to the coaxial cable 85. The filter 135 may be configured to filter out-of-band spurious emissions and ensure that the upstream transmissions do not generate interferences in the downstream spectrum. The filter 135 may contribute significantly to the frequency response of the analog frontend.

The hardware architecture of the transmitter 96 as illustrated in FIG. 3 relies on a single PGA 134 which provides combined analog amplification in the analog domain. If compared to reference implementations where each channel 121-125 has a dedicated PGA, such a hardware architecture provides reduced complexity.

Figure 4:
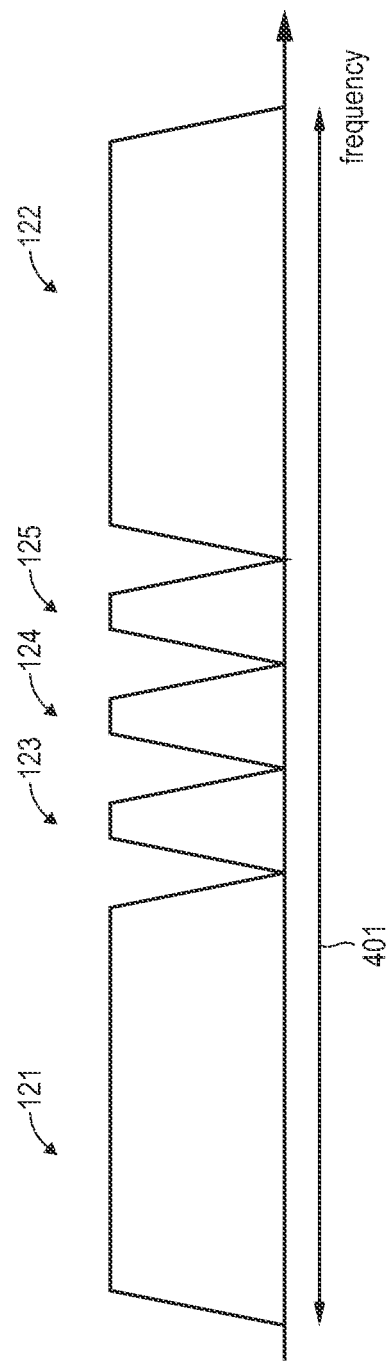
FIG. 4 schematically illustrates a transmission bandwidth according to various examples.

FIG. 4 illustrates aspects with respect to the transmission BW 401. The transmission BW 401 is fractioned using an FDD approach. Different channels 121-125 occupy different BWs.

Figure 5:
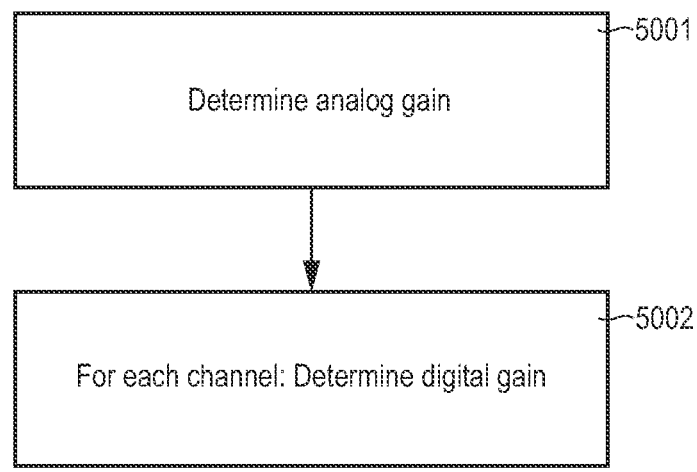
FIG. 5 is a flowchart of a method according to various examples.

FIG. 5 is a flowchart of a method according to various examples. For example, the method according to FIG. 5 could be executed by the control logic 95 of a respective modem 91-94.

First, in block 5001, an analog gain of the PGA 134 is determined. Next, in block 5002, digital gains are determined for the digital amplifiers 111-115 of each channel 121-125.

Then, it is possible to implement the determined analog gain and digital gains by appropriately controlling the DFE 961 and the AFE 962.

Depending on the implementation, the method according to FIG. 5 may be re-executed over the course of ongoing communication in the communication system 90 from time to time. Different trigger criteria for executing the method according to FIG. 5 are conceivable. In one example, it would be possible that the transmission protocol defines a protected time duration during which data is not communicated on the various channels 121-125. For example, a protected time duration may be used for training once the architecture of the communication system 90 changes, e.g., if a new modem comes online or if a modem goes off-line. Then, it would be possible that the control logic 95 is configured to determine the analog gain in block 5001 and optionally the digital gains in block 5002 in response to the protected time duration.

Hereinafter, various techniques of determining the analog gain in block 5001 and the digital gains in block 5002 will be described. For example, it would be possible to take into account calibration data when determining the analog gain in block 5001.

Figure 6:
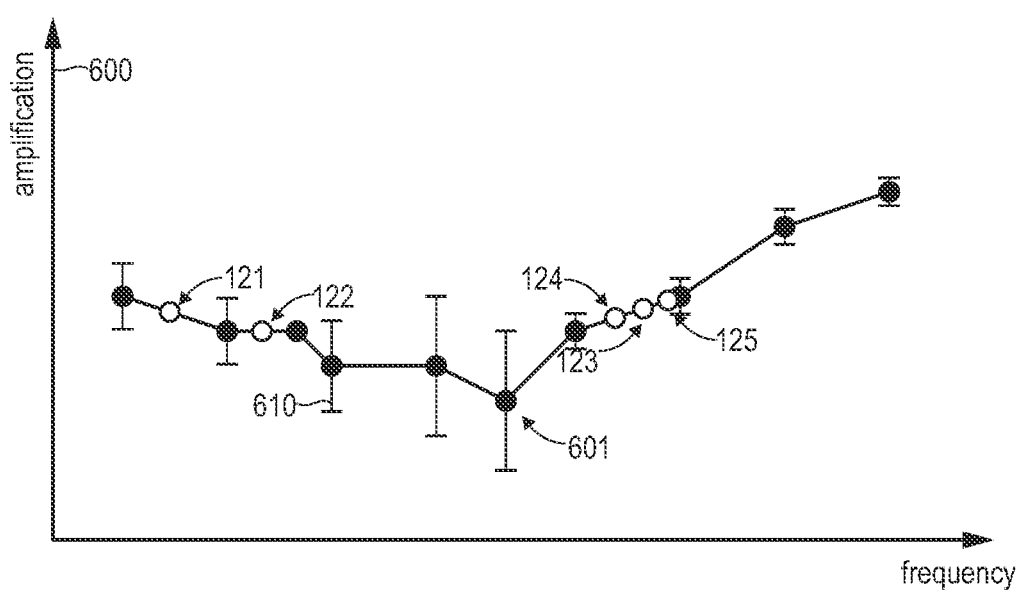
FIG. 6 schematically illustrates calibration data of a programmable gain amplifier of the analog frontend according to various examples.

FIG. 6 illustrates aspects with respect to calibration data 600. The calibration data is indicative of the frequency response 600 of the analog frontend 962. The frequency response 600 may be influenced by the PGA 134, the filter 133, and/or the filter 135. The frequency response 600 specify a dependency of the signal output power on the frequency. As can be seen from the example of FIG. 6, a non-flat frequency response 600 can be encountered. For example, a low-amplification regime 601 is encountered where the amplification of the PGA 134 is particularly small. Hence, despite setting a certain nominal analog gain, certain frequencies will be amplified less than other frequencies.

For example, the calibration data 600 could be obtained during a calibration phase. The calibration phase may be performed in a backend test during manufacturing at the factory. It is generally possible that each individual transmitter 96 is calibrated; in other examples, it would be possible that a batch calibration is performed. In particular, in such an example, it is possible that the calibration data 600 also specifies tolerances 610 of the frequency response 600 which may originate from manufacturing spread.

Based on such calibration data 600, it is possible to determine the analog gain. In an example, the calibration data may specify the frequency response of the PGA at a plurality of calibrated frequencies within the transmission BW (full circles in FIG. 6). It is then possible to interpolate the frequency response between multiple calibrated frequencies to obtain the frequency response at the carrier frequencies (non-filled circles in FIG. 6) of the plurality of channels.

For example, the calibration data 600 may include a calibration table which contains several frequency points. A reference frequency point may specify the absolute power of the analog output signal measured at that point, designated as $P_{cal\_table\_ref}$. The remaining frequency points may contain the delta between power measured at that frequency and $P_{cal\_table\_ref}$. Alternatively or additionally, the table may contain the absolute power at each calibrated point or at least at some calibrated points. In addition, the calibration table may be associated with the analog gain used during calibration, $PGA\_Set_{cal}$, the digital gains for the various digital signals used during calibration, $D\_Att_{cal}$, and the modulation scheme used during calibration $Mod_{cal}$. In some examples, such values may be indicated by the calibration table. It would also be possible that they are known to the system designer as a general framework within which the calibration table is defined.

A compensation of the frequency response based on a constellation gain difference between the modulation scheme used during calibration and at least one modulation scheme used to digitally modulate the symbols according to the transmission protocol can then be performed. After adjusting for the constellation gain difference between the constellation used in calibration and the 64QAM that is assumed in power commands in DOCSIS SC-QAM, the compensated calibration point $P_{cal\_ref}$ is then given by:

$$P_{cal\_ref} = P_{cal\_table\_ref} - \text{Offset}(Mod_{cal}) + D\_Att_{cal} + 20\log\left(\frac{\text{Ref\_Channel\_Gain\_SCQAM}}{\text{Ref\_Channel\_Gain\_cal}}\right), \quad (1)$$

where Ref_Channel_Gain_SCQAM is the reference channel gain of an SC-QAM channel as explained later in greater detail, Ref_Channel_Gain_Cal is the channel gain used during calibration, and Offset($Mod_{cal}$) is the constellation gain of the calibrating signal relative to 64-QAM.

After compensating the calibration data for the parameters of the calibrating signal, the calibration points are given by:

$$P_{cal\_point_k} = P_{cal\_table\_point_k} - \text{Offset}(Mod_{cal}) + D\_Att_{cal} + 20\log\left(\frac{\text{Ref\_Channel\_Gain\_SCQAM}}{\text{Ref\_Channel\_Gain\_cal}}\right)$$

Each calibrated point $P_{cal\_point\_n}$ may be represented as the delta from a reference point or as absolute measured power at that point.

$$P_{cal\text{-}point_k} = P_{cal\text{-}ref} + \Delta P_{cal\text{-}point_k}$$

An arbitrary calibration point may be selected as a reference, e.g. the first data point in the table, and the rest of the calibration points may then be referenced to as delta from the selected reference point.

Out of all the calibration points over frequency, a single value is then assigned for each channel 121-125, $P_{cal\_channel\_n}$, by means of first linearly interpolating the calibration points (compensated for the parameters of the calibrating signal) and then averaging the points that belong to the channel's frequency band.

The analog gain may be determined by mapping the low-amplification regime 601 of the frequency response to a predefined target output power. For example, the analog gain may be determined relative to the frequency point where minimum power was measured during calibration to guarantee sufficient gain for any frequency: $P_{cal\_min}$ denotes the lowest power that was measured in the relevant frequency band during calibration.

$$P_{cal\text{-}min}[\text{dBmV}] = P_{cal\_ref} + \min[\Delta P_{cal\_point_1} \cdots \Delta P_{cal\_point_{cal\_table\_size}}] = \min[P_{cal\_point_1} \cdots P_{cal\_point_{cal\_table\_size}}] \quad (2)$$

In one example, it is possible to determine the analog gain based on a reference signal level of the digital output signal. For example, the reference signal level may correspond to an upper boundary of a dynamic range window of the transmission protocol. For example, in the context of DOCSIS 3.1 the reference signal level may be specified as the maximum equivalent channel power $P_{1.6hi}$, see DOCSIS 3.1, Physical Layer Specification, CM-SP-PHYv3.1-109-160602, chapter 7.4.12.2 Transmit Power Requirements.

In DOCSIS3.1, the commanded power per 1.6 MHz for digital signal/channel n is designated as $P_{1.6r\_n}$ or $P_{1.6c\_n}$, the maximum power per 1.6 MHz is designated as $P_{1.6hi}$ and the back-off of all channels from $P_{1.6hi}$ is designated as $P_{1.6load\_min\_set}$. When the power of a digital signal is within the dynamic rage window, fidelity requirements are to be met. A typical size of the dynamic range window is 12 dB. $P_{1.6load\_n}$ of each digital signal during operation may be higher than $P_{1.6load\_min\_set}$, but the digital signal power levels may be increased so that $P_{1.6load\_n} = P_{1.6load\_min\_set}$ and the fidelity requirements would still need to be met. The commanded power $P_{1.6c\_n}$ should be within the dynamic range window.

Then, the total power output across all frequencies when all digital signals corresponding to the various channels are at the top of the dynamic range window equals to:

$$P_{drw\_top\_total}(RF\_Out)[dBmV] = P_{1.6hi} + 10\log\left(\frac{BW}{1.6}\right) - P_{1.6load\_min\_set}. \quad (3)$$

The first step is to calculate the required PGA gain for the low amplification regime 601, limited to maximal gain setting:

$$PGA\_Set_{calc} = PGA\_Set_{cal} + P_{drw\_top\_total}(RF\_Out) - P_{cal\_min}, \text{ and} \quad (4)$$

$$PGA\_Set_{step1} = \min(PGA\_Set_{max}, \text{roundup}(PGA\_Set_{calc})). \quad (5)$$

PGA_Set$_{calc}$ according to Eq. (4) is the "ideal" setting that would bring the output power to the target output power, not constrained by the actual range and granularity of the gain of a PGA.

PGA_Set$_{step1}$ according to Eq. (5) is the actual PGA gain setting, found by rounding up PGA_Set$_{calc}$ to the nearest existing PGA gain setting and clipping it if the result is above the max available setting. For example, the PGA may provide the adjustable analog gains with a certain granularity or minimum step width so that discrete settings are available. In other words, the PGA may be configured to implement different analog gains at a certain adjustment increment. The roundup calculation allows to identify the difference between the determined analog gain and the adjustment increment of the PGA.

Sometimes, the PGA may have a certain tolerance of amplification or, generally, there may be a tolerance specified for the frequency response. For example, certain gain settings may be associated with an inaccuracy. For example, if a nominal analog gain is applied, the actual amplification may deviate. This is schematically indicated in FIG. 6 by the error bars. It is possible to determine the analog gain further based on this tolerance. Since the PGA may have inaccuracy in the gain step, it can be desirable to verify that the actual PGA gain is not too low. This can be done to avoid an error in the output power or a potential violation of the target back-off if the error is compensated for by digital gain.

The correction that may be applied when using the PGA_Set$_{step1}$ setting to get the desired gain is given by:

$$Corr_{step1} = PGA\_Set_{calc} - [PGA\_Set_{step1} + PGA\_Gain\_Step\_Err(PGA\_Set_{step1}) - PGA\_Gain\_Step\_Err(PGA\_Set_{cal})], \quad (6)$$

where PGA_Gain_Step_Err is a lookup table containing the cumulative error from a specific gain setting to all other gain settings. This table may be obtained from characterization of gain errors of large number of PGA components of the same model.

Corr$_{step1}$ is indicative of how much gain is lacking. If Corr$_{step1}$ is negative then there is no lack of gain. If the number is positive, i.e., correction should be applied, then the gain deficit can be compensated for by increasing the analog gain setting accordingly. For example, if there is 1.4 dB gain deficit and PGA adjustment increment is 1 dB, the analog gain of the PGA 134 may be increased by 2 dB and the digital gains may be reduced for all digital signals 171-175 by 0.6 dB. Thus, generally, it is possible to determine the digital gains of the digital signals based on the determined analog gain.

The updated setting can be calculated as:

$$PGA\_Set_{comp} = \begin{cases} PGA\_Set_{step1} & \text{when } Corr_{step1} < 0 \\ PGA\_Set_{step1} + \text{roundtop}(Corr_{step1}) & \text{otherwise} \end{cases}, \quad (7)$$

where PGA_Set$_{comp}$ is the analog gain compensated for the potential lack of gain due to the finite adjustment increment.

To get the final analog gain, PGA_Set$_{comp}$ must be limited to the maximum available setting if it is above PGA_Set$_{max}$ setting, i.e., the maximum setting available by the PGA.

$$PGA\_Set = \min(PGA\_Set_{max}, PGA\_Set_{comp}) \quad (8)$$

PGA_Set is the analog gain programmed to the PGA.

Once the analog gain has been determined, the digital gains for the various digital signals 171-175 can be determined. In other examples, it would also be possible to first determine the digital gains and then determine the analog gain.

For example, the digital gains of the digital signals 171-175 may be determined by mapping a reference signal level of the digital output signal to a predefined input signal level of the DAC. For example, the reference signal level of the digital output signal may correspond to the upper boundary of a dynamic range window of the transmission protocol, i.e., where all digital signals 171-175 are at their respective upper boundary permissible under the transmission protocol. This enables calculating digital gains and the analog gain such that when all digital signals 171-175 are commanded to be at the upper boundary of the dynamic range window, the DAC will be optimally loaded, i.e., the signal level of the digital output signal is at the target back-off from full-scale of the DAC. Clipping is avoided. Optimally loading the DAC reduces clipping; while at the same time increasing the available dynamic range, because the signal is as high above noise floor as possible, but not too high to keep clipping at a low level.

FIG. 7 illustrates aspects with respect to a dynamic range window 701 of the digital signals 171-175 and, hence, of the digital output signal 181. In FIG. 7, the upper boundaries 711 and lower boundaries 712 of the dynamic range windows of the various digital signals 171-173 are illustrated (while, for sake of simplicity, in FIG. 7 the dynamic range windows 701 are only illustrated for the digital signals 171-173; similar dynamic range windows could be defined for all digital signals 171-175; generally, there may be more or fewer channels, e.g., ten channels). These are defined according to DOCSIS 3.1, Physical Layer Specification, CM-SP-PHYv3.1-I09-160602, chapter 7.4.12.2 Transmit Power Requirements.

For determining the digital gains, a reference digital gain per digital signal 171-175 can be determined. For example, this reference digital gain can be defined as the digital gain that would bring the RMS level of that digital signal 171-175 to be at the target back-off 752 of the DAC 132 against its maximum (full scale) input level 751. Digital signal RMS that is backed off from the digital full scale value by X dB will normally result in analog signal RMS at the output that is backed off from the analog full-scale output power by the same X dB.

$$\text{Reference\_Channel\_Gain}_n = \frac{Val_{peak}(\text{DAC\_In})}{\text{DAC\_Gain} * 10^{\left(\frac{TBOF[dB]}{20}\right)} * \text{Init\_val\_RMS}_{channel_n} * \text{Fixed\_Gain}_{channel_n}}, \quad (9)$$

where $\text{Init\_val\_RMS}_{channel\_n}$ is the root mean square (RMS) value of the digital samples of channel n, before application of any variable gain, $\text{Fixed\_Gain}_{channel\_n}$ is the constant gain of the channel that depends on the channel type, $Val_{peak}$ is the input value to the DAC that sets maximum voltage at the output, DAC Gain is the digital gain that is applied to the sum of all channels.

The parameter TBOF specifies the target backoff 752 provided as headroom to avoid clipping at the DAC. This specifies a predefined input signal level of the DAC.

Eq. 9 can be re-written for a digital signal 173-175 employing SC-QAM modulation:

$$\text{Reference\_Channel\_Gain\_SCQAM} = \frac{Val_{peak}(\text{DAC\_In})}{\text{DAC\_Gain} * 10^{\left(\frac{TBOF[dB]}{20}\right)} * \text{Init\_val\_RMS}_{SC-QAM} * \text{Fixed\_Gain}_{SC-QAM}}. \quad (10)$$

Here, the same reference digital gain can be obtained for all SC-QAM modulated digital signals.

Eq. 9 can also be re-written for a digital signal 171-172 employing OFDM modulation:

$$\text{Reference\_Channel\_Gain\_OFDMA} = \frac{Val_{peak}(\text{DAC\_In})}{\text{DAC\_Gain} * 10^{\left(\frac{TBOF[dB]}{20}\right)} * \text{Init\_val\_RMS}_{OFDMA} * \text{Fixed\_Gain}_{OFDMA}} \quad (11)$$

Here, different reference digital gains can be obtained for different digital signals 171-172 using OFDM modulation, depending on the frequencies.

Based on the reference digital gains according to Eqs. 10 and 11, the digital gain for the various digital signals 171-175 can be determined based on one or more of the following parameters: Overall modulated BW ($F_{BW}$), see Eq. 12; Frequency response ($F_{fr\_response}$), see Eq. 13; Commanded power $P_{1.6c\_n}(F_{pwr})$, see Eq. 14; Commanded power offset related to the configuration of a channel, e.g. to account for boosted pilots in OFDMA ($F_{config}$); Compensation of the gain deficit for the used PGA gain setting ($\text{FPGA}_{comp}$), see Eq. 16. I.e., the required analog gain as determined and the actual analog gain that can be set resulting from the adjustment increment of the PGA may differ. This relates to a difference between the determined analog gain and an adjustment increment of the PGA.

$$F_{BW_n}[dB] = 10\log\left(\frac{BW_{modulated}[\text{MHz}]}{BW_{channel_n}[\text{MHz}]}\right). \quad (12)$$

$$F_{fr\_response_n}[dB] = P_{cal\_channel_n}[dBmV] - P_{cal\_min}[dBmV] \quad (13)$$

$$F_{pwr_n}[dB] = P_{1.6drw\_top}[\text{RF\_Out}][dBmV] - P_{1.6c\_n}[dBmV], \quad (14)$$

with $$P_{1.6drw\_top}[\text{RF\_Out}][dBmV] = P_{1.6hi} - P_{1.6load\_min\_set} \quad (15)$$

$$F_{PGA\_comp}[dB] = \quad (16)$$
$$-\{\text{PGA\_Gain}_{calc} - [\text{PGA\_Set} + \text{PGA\_Gain\_Step\_Err}(\text{PGA\_Set}) - \text{PGA\_Gain\_Step\_Err}(\text{PGA\_Set}_{cal})]\}$$

A cumulative correction value with respect to the reference digital gain is given by:

$$Att_n = F_{BW_n} + F_{fr\_response_n} + F_{pwr_n} + F_{config_n} + F_{PGA-comp} \quad (17)$$

The digital gain for each digital signal 173-175 modulated by SC-QAM is given by:

$$\text{Channel\_Gain\_SCQAM}_n = \frac{\text{Ref\_Channel\_Gain\_SCQAM}}{10^{\left(\frac{Att_n}{20}\right)}} \quad (18)$$

The digital gain for each digital signal 171-172 modulated by OFDM is given by:

$$\text{Channel\_Gain\_OFDM}_n = \frac{\text{Ref\_Channel\_Gain\_OFDMA}_n}{10^{\left(\frac{Att_n}{20}\right)}} \quad (19)$$

Summarizing, above techniques have been described which enable to determine the digital gains of a plurality of digital signals which are then combined to a digital output signal. The digital output signal is converted to an analog output signal which is again amplified by a PGA at an analog gain.

Determination of the digital gains and the analog gain receives as inputs the calibration data of the PGA, i.e., characterization results of the PGA, the number of digital signals, the BW of each digital signal, the commanded signal levels per digital signal, e.g., according to a transmission protocol, and the desired back-off from full scale of the DAC to avoid clipping. Then, the digital gains of the digital signals and the analog gain are determined such that the combined SNR which includes thermal noise and digital quantization noise is optimized.

Although the invention has been shown and described with respect to certain preferred embodiments, equivalents and modifications will occur to others skilled in the art upon the reading and understanding of the specification. The present invention includes all such equivalents and modifications, and is limited only by the scope of the following claims.

For illustrative purposes, while above various techniques have been described with respect to US communication, similar techniques may be readily employed for DS communication.

Likewise, while above techniques have been described for DOCSIS 3.1 transmission, similar techniques may be readily applied for other multi-carrier transmission protocols.

What is claimed is:

1. A device, comprising:
   a digital frontend configured to digitally modulate symbols for digital signals of a plurality of channels according to a transmission protocol, each channel being associated with at least one respective carrier frequency within a transmission bandwidth, and to combine the digital signals to obtain a digital output signal,
   an analog frontend having a digital-to-analog converter configured to convert [the digital output signal into an analog output signal and a programmable gain amplifier configured to apply an analog gain to the analog output signal, and
   a control logic configured to determine the analog gain based on calibration data indicative of a frequency response of the analog frontend at a plurality of calibrated frequencies across the transmission bandwidth.

2. The device of claim 1,
   wherein the control logic is configured to determine the analog gain by mapping a low-amplification regime of the frequency response to a predefined target output power.

3. The device of claim 1,
   wherein the control logic is configured to determine the analog gain based on a reference signal level of the digital output signal,
   wherein the reference signal level of the digital output signal optionally corresponds to an upper boundary of a dynamic range window of the transmission protocol.

4. The device of claim 1, wherein the control logic is configured to interpolate the frequency response between multiple calibrated frequencies to obtain the frequency response at the carrier frequencies of the plurality of channels.

5. The device of claim 1,
   wherein the calibration data is further indicative of a tolerance of the frequency response,
   wherein the control logic is configured to determine the analog gain further based on the tolerance.

6. The device of claim 1,
   wherein the digital frontend is further configured to apply a respective digital gain to each digital signal,
   wherein the control logic is configured to determine the digital gains of the digital signals based on the determined analog gain.

7. The device of claim 6,
   wherein the control logic is configured to determine the digital gains of the digital signals based on a difference between the determined analog gain and an adjustment increment of the programmable gain amplifier and to offset the determined analog gain based on said difference.

8. The device of claim 1,
   wherein the digital frontend is further configured to apply a respective digital gain to each digital signal,
   wherein the control logic is configured to determine the digital gains of the digital signals by mapping a reference signal level of the digital output signal to a predefined input signal level of the digital-to-analog converter,
   wherein the reference signal level of the digital output signal optionally corresponds to an upper boundary of a dynamic range window of the transmission protocol.

9. The device of claim 1,
   wherein the digital frontend is further configured to apply a respective digital gain to each digital signal,
   wherein the control logic is configured to determine the digital gains based on at least one of a modulated bandwidth of each one of the plurality of channels and a frequency response of each one of the plurality of channels.

10. The device of claim 1,
    wherein the digital frontend is configured to digitally modulate the symbols for at least one first digital signal according to a single carrier quadrature amplitude modulation, SC-QAM, scheme of the transmission protocol and to digitally modulate the symbols for at least one second digital signal according to an orthogonal frequency division multiplexing, OFDM, scheme of the transmission protocol.

11. The device of claim 1,
    wherein the calibration data is associated with at least one of the following: digital gains applied to the digital signals during calibration; at least one modulation scheme employed for digitally modulating the symbols during calibration;
    and the analog gain of the programmable gain amplifier during calibration.

12. The device of claim 1,
    wherein the transmission protocol defines a protected time duration during which data is not communicated on the plurality of channels,
    wherein the control logic is configured to determine an analog signal gain in response to the protected time duration.

13. A device, comprising:
    a digital frontend configured to digitally modulate symbols for digital signals of a plurality of channels according to a transmission protocol, each channel being associated with at least one respective carrier frequency within a transmission bandwidth, and to combine the digital signals to obtain a digital output signal,
    an analog frontend having a digital-to-analog converter configured to convert the digital output signal into an analog output signal and a programmable gain amplifier configured to apply an analog gain to the analog output signal, and
    a control logic configured to determine the analog gain based on calibration data indicative of a frequency response of the analog frontend across the transmission bandwidth,
    wherein the control logic is configured to compensate the frequency response based on a constellation gain difference between a modulation scheme used during calibration and at least one modulation scheme used to digitally modulate the symbols according to the transmission protocol.

14. The device of claim 13,
    wherein the control logic is configured to determine the analog gain by mapping a low-amplification regime of the frequency response to a predefined target output power.

15. The device of claim 13,
    wherein the control logic is configured to determine the analog gain based on a reference signal level of the digital output signal, wherein the reference signal level of the digital output signal optionally corresponds to an upper boundary of a dynamic range window of the transmission.

16. The device of claim 13,
wherein the digital frontend is further configured to apply a respective digital gain to each digital signal,
wherein the control logic is configured to determine the digital gains of the digital signals based on the determined analog gain.

17. The device of claim 16,
wherein the control logic is configured to determine the digital gains of the digital signals based on a difference between the determined analog gain and an adjustment increment of the programmable gain amplifier and to offset the determined analog gain based on said difference.

18. The device of claim 13,
wherein the digital frontend is further configured to apply a respective digital gain to each digital signal,
wherein the control logic is configured to determine the digital gains of the digital signals by mapping a reference signal level of the digital output signal to a predefined input signal level of the digital-to-analog converter,
wherein the reference signal level of the digital output signal optionally corresponds to an upper boundary of a dynamic range window of the transmission protocol.

19. The device of claim 13,
wherein the digital frontend is further configured to apply a respective digital gain to each digital signal,
wherein the control logic is configured to determine the digital gains based on at least one of a modulated bandwidth of each one of the plurality of channels and a frequency response of each one of the plurality of channels.

20. The device of claim 13,
wherein the calibration data is associated with at least one of the following: digital gains applied to the digital signals during calibration; at least one modulation scheme employed for digitally modulating the symbols during calibration; and the analog gain of the programmable gain amplifier during calibration.

* * * * *